United States Patent
Higgs et al.

(10) Patent No.: US 6,545,340 B1
(45) Date of Patent: Apr. 8, 2003

(54) SEMICONDUCTOR DEVICE

(75) Inventors: Anthony W Higgs, Malvern (GB); David G Hayes, Malvern (GB); Robert G Davis, Co Durham (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/786,508

(22) PCT Filed: Sep. 6, 1999

(86) PCT No.: PCT/GB99/02951

§ 371 (c)(1),
(2), (4) Date: Mar. 6, 2001

(87) PCT Pub. No.: WO00/17935

PCT Pub. Date: Mar. 30, 2000

(30) Foreign Application Priority Data

Sep. 22, 1998 (GB) .............................. 9820567

(51) Int. Cl.$^7$ ................................ H01L 31/11
(52) U.S. Cl. .................. 257/565; 257/47; 257/197; 257/542
(58) Field of Search .................. 257/47, 197, 198, 257/373, 542, 565; 357/4, 34, 45; 438/235, 309; 326/119, 121; 364/716, 784, 787

(56) References Cited

U.S. PATENT DOCUMENTS 4,533,842 A * 8/1985 Yang et al. .................. 323/313
5,027,179 A * 6/1991 Yokoyama et al. ......... 257/198

(List continued on next page.)

FOREIGN PATENT DOCUMENTS

| EP | 0 778 622 | 6/1997 |
| GB | 2 288 691 | 10/1995 |
| WO | WO92/19017 | 10/1992 |

OTHER PUBLICATIONS

Shiou–Ying Cheng et al.: "Allnas/ingaas long–period–superlattice resonant–tunnelling transistor (LPSRTT)" Electronics Letters, GB, IEE Stevenage, vol. 33, No. 6, pp. 534–535.

Whn–Chau Liu et al.: "A new functional, resonant–tunneling bipolar transistor with a superlattice emitter" Journal of Applied Physics, US, American Institute of Physics. New York, vol. 70, No. 1, pp. 485–489.

Guang–Bo Gao et al.: "Emitter ballasting resistor design for, and current handling capability of ALGAAS/GAAS power heterojunction bipolar transistors" IEEETransactions on Electron Devices, US, IEEE Inc. New York, vol. 38, No. 2, pp. 185–196.

Grave I et al.: "Monolithic integration of a resonant tunneling diode and a quantum well semiconductor laser" Applied Physics Letters, US, American Institute of Physics. New York, vol. 58, No. 2, pp. 110–112.

Yokoyama N et al.: "New quantum functional devices. —Present status and future prospects of RHET technology—" Proceedings of the International Conference on Indium Phosphide and Related Materials, US, New York, IEEE, vol. Conf. 7, pp. 847–850.

Patent Abstracts of Japan, vol. 16, No. 23 [E–1157] & JP030240285 (Nippon Telegraph & Telephone).

*Primary Examiner*—David Nelms
*Assistant Examiner*—Dao H. Nguyen
(74) *Attorney, Agent, or Firm*—Nixon & Vanderhye P.C.

(57) ABSTRACT

A semiconductor device of the invention in the form of a superlattice-heterojunction bipolar transistor (SL-HBT) 10 incorporates a superlattice region 16 within an emitter mesa 21. The superlattice region 16 provides a non-linear response to a sufficiently high level of device current to counteract thermal runaway. This protects the device from damaging levels of current. The device 10 may be a radio-frequency SL-HBT with performance equivalent to that of a conventional heterojunction bipolar transistor. The invention may also be implemented as a semiconductor laser.

8 Claims, 12 Drawing Sheets

U.S. PATENT DOCUMENTS 5,031,005 A * 7/1991 Futatsugi et al. ............... 357/4
5,265,044 A * 11/1993 Singh ........................... 326/35
5,278,427 A * 1/1994 Choi ............................ 257/17
5,389,803 A * 2/1995 Mohammad ................ 257/197
5,408,102 A * 4/1995 Okumura .................... 250/551
5,764,679 A   6/1998 Jiang et al.
5,828,077 A   10/1998 Liu et al.
6,130,559 A * 10/2000 Balsara et al. .............. 326/112

* cited by examiner

| Layer No. | Layer Thickness | Material | Doping density (atoms/cm3) | Details of layer in device | SL cell rpts |
|---|---|---|---|---|---|
| 17 | 0.5μm | n+GaAs | 2E18 | electrode | |
| 16j | 100Å | n+Al0.15G0.85As | 2E18 | injector | |
| 16i | 100Å | nAl0.15G0.85As | 5E17 | injector | |
| 16h₁ | 9ml(~26Å) | n⁻Al0.33G0.67As | 5E16 | SL barrier | 25 rpts |
| 16g₁ | 12ml(~26Å) | n⁻GaAs | 5E16 | SL well | |
| 16f | 9ml(~26Å) | n⁻Al0.33G0.67As | 5E16 | SL barrier | |
| 16e | 100Å | nAl0.15G0.85As | 5E17 | injector | |
| 16d | 100Å | n+Al0.15G0.85As | 2E18 | injector | |
| 16c | 200Å | n+GaAs | 2E18 | electrode region | |
| 16b | δ-doping | Si | 2E12 (cm⁻²) | compensation layer | |
| 16a | 200Å | n+GaAs | 2E18 | electrode region | |
| 15 | 400(±50)Å | n GaAs | 3(±0.3)E17 | emitter 2 | |
| 14 | 500(±50)Å | n InGaP | 3(±0.3)E17 | emitter (lattice matched) | |
| 13 | 800(±50)Å | p+GaAs | 4(±0.4)E19 | base (C doped) | |
| 12 | 1.0(±0.05)μm | n⁻GaAs | 7(±0.7)E15 | collector | |
| 11 | 0.7(±0.07)μm | n+GaAs | ≥ 5E18 | sub-collector | |
| 0.5mm substrate | | GaAs | undoped | semi-insulating | |

| Layer No. | Layer Thickness | Material | Doping density (atoms/cm3) | Details of layer in device |
|---|---|---|---|---|
| 56 | 0.80μm | n+GaAs | 2E18 | electrode |
| 55 | 400(±50)Å | n GaAs | 3(±0.3)E17 | emitter 2 |
| 54 | 500(±50)Å | n InGaP | 3(±0.3)E17 | emitter (lattice matched) |
| 53 | 800(±50)Å | p+GaAs | 4(±0.4)E19 | base (C doped) |
| 52 | 1.0(±0.05)μm | n−GaAs | 7(±0.7)E15 | collector |
| 51 | 0.7(±0.07)μm | n+GaAs | ≥ 5E18 | sub-collector |
| — | 0.5mm substrate | GaAs | undoped | semi-insulating |

SEMICONDUCTOR DEVICE

BACKGROUND OF THE INVENTION

1. Field of the Invention

The invention relates to a semiconductor device with current limiting properties, and more particularly (although not exclusively) to a transistor or a vertical-cavity surface-emitting laser (VCSEL).

2. Discussion of Prior Art

Thermal runaway has been a known problem in semiconductor devices since the 1950s. It is particularly relevant to devices composed of narrow bandgap materials operated at ambient temperature and those of wider bandgap materials operated at elevated temperatures (eg high power devices). It results from device resistance falling with an increase in temperature, device current increasing in consequence, temperature increasing and resistance falling further and so on. It can lead to catastrophic device failure.

One form of semiconductor device incorporates an electrically parallel array of current-carrying elements intended to carry like currents, and in this device small growth or fabrication non-uniformities amongst individual elements can lead to localised heating during operation. This results in an individual element of the device carrying most of the current through the device by the process of thermal runaway. Examples of such semiconductor devices are multi-finger bipolar power transistors and VCSEL arrays. If a localised defect should induce an increase of current in a particular part of the device, an increase in temperature will be produced which in turn induces further increments in the localised current by increasing the number of charge carriers. Positive electrical and thermal feedback in a locality results in a non-uniform current distribution amongst the various elements, causing failure of the device as a whole, and may also lead to the destruction of the individual element concerned. The effect whereby a single element conducts most of the current through a device is known as "current-hogging".

In the case of an array of electrically-parallel VCSELs, the current-hogging problem may lead to catastrophic damage in individual lasers which have a lower resistance than the other members of the array. Variations in the resistances of these lasers also result in variations in the currents conducted by them, and hence to non-uniform brightness across the array.

In the context of bipolar transistors, the current-hogging problem has meant that multi-finger devices have been unreliable during high-power operation in the absence of stabilisation schemes to eliminate the problem of thermal runaway. Current-hogging by a single emitter finger causes failure of the entire transistor, i. e. a collapse in current gain, output power, and available voltage swing during radio-frequency (RF) operation. Permanent damage may occur to the current-hogging emitter finger.

Several current stabilisation schemes for multi-finger power transistors have been proposed. One such scheme involves the integration of a fixed stabilising resistor, or "ballast resistor", into the structure in order to limit the current flowing through any single finger. Fixed ballast resistors have been integrated into the emitter and base regions of transistors, as reported by Gao et al and Liu et al in the IEEE Transactions on Electron Devices, Volume 21, No. 7, 1991 and Volume 38, No. 2, 1996 respectively. However such designs have the disadvantage that under low current and/or temperature conditions, there is a significant penalty to the RF power efficiency of the transistor because current is limited through all the fingers of the device simultaneously, including those fingers which do not have the problem of thermal runaway.

In another stabilisation scheme, known as thermal shunting, the emitter fingers of a transistor are thermally coupled to each other by a metal bridge in order to reduce temperature non-uniformities. In IEEE Electron Device Letters, Volume 17, No. 1, 1996, an example of a thermally-shunted bipolar transistor was disclosed by Sewell et al. In yet another scheme, disclosed at the 1994 IEEE International Electron Devices Meeting by Yang et al, a recess is etched into the reverse side of the substrate opposite the active layers, and metallised to form a heatsink. Schemes such as these involve many processing steps in addition to wafer growth and processing, significantly increasing the overall processing time and cost.

SUMMARY OF THE INVENTION

It is an object of the invention to provide an alternative form of semiconductor device in which current is limited.

The present invention provides a transistor comprising an emitter incorporating a superlattice structure, a base and a collector characterised in that the transistor has an emitter-current versus base-emitter voltage characteristic which exhibits a first region below a critical emitter-current and having a non-zero slope of average value $m_1$, a reduction in slope from the value $m_1$ at the critical emitter-current; and a current plateau above the critical emitter-current, the plateau having an average slope $m_2$ in the range $-0.05\, m_1 \leq m_2 \leq +0.05\, m_1$.

The invention provides the advantage that a current-carrying element within a semiconductor device of the invention is protected from thermal runaway. Also, in a semiconductor device of the invention having a plurality of electrically parallel current carrying elements (for example a multi-finger transistor or a VCSEL array) the invention provides the advantage that any current-hogging by one or more elements of the device, and hence imbalance in current distribution within the device, is counteracted . This is achieved by increases in the resistances of those elements which begin to draw abnormally high currents without changing the resistances of, or currents in, the remaining elements. Unnecessary reductions in the currents carried by the remaining elements are therefore avoided and the functioning of these elements is unaffected. The risk of catastrophic damage to an element which begins to draw an abnormally high current is reduced.

A current-carrying element of a device of the invention has a non-linear current versus voltage characteristic. More specifically, a current-carrying element of a device of the invention has a differential resistance which is substantially constant up to a critical current, and then increases very rapidly with increasing current to a much greater value. Current-carrying elements of devices of the invention are therefore protected against thermal runaway.

Devices of the invention may be entirely fabricated using epitaxial growth methods and processing methods familiar to those skilled in the art of semiconductor device fabrication.

A device of the invention has a further advantage over a prior art device incorporating a fixed ballast resistor. The superlattice structure is typically ten times thinner than such a resistor, providing a shorter heat-conducting path from the active region of the semiconductor device to the contact metallisation. The resulting improvement in heat dissipation increases the lifetime of the device and reduces its susceptibility to thermal runaway.

Devices of the invention in the form of bipolar transistors may be used in radio frequency (RF) amplifying circuits. They can provide a current limit within the natural current limit of the transistor, and hence current-clipping of the input waveform, which makes it possible to achieve very high efficiency RF amplification. Presently, current-clipping is achieved in RF amplifiers by driving the transistor to its natural saturation current, resulting in charge storage in the transistor which severely degrades the gain bandwidth of the amplifier.

A semiconductor device of the invention may be in the form of a heterojunction bipolar transistor device in which the superlattice structure adjoins a first active region and forms an emitter in combination with the first active region and a second active region comprises both the base and collector, the second active region adjoining the first active region at a side thereof opposite to that adjoining the superlattice structure.

A semiconductor device of the invention may be in the form of a semiconductor laser having first and second active regions, the first active region including an optical gain layer and the superlattice structure adjoining the first active region at a side thereof opposite to that adjoining the second active region. The optical gain layer may have optical cladding. The device may be replicated to form an array of lasers. It may be constructed at least partly of layers of the $Al_xGa_{1-x}As$ material system, where $0 \leq x \leq 1$.

A semiconductor device of the invention may have a plurality of individual first active regions all adjoining a second active region, and the superlattice structure may comprise individual superlattice structures each adjoining a respective first active region and each having a current versus voltage characteristic which exhibits a change in resistance at a critical current to prevent current within a corresponding first active region from reaching an undesirable level. It may be a heterojunction bipolar transistor device having base, collector and emitter elements, each superlattice structure forming an emitter element in combination with a respective first active region, the second active region comprising both base and collector elements and each superlattice structure adjoining a respective first active region at a side thereof opposite to that adjoining the second active region. The transistor base element may be of InGaP and other device parts may be of the $Al_xGa_{1-x}As$ material system, where x=0, 0.15 or 0.33.

BRIEF DESCRIPTION OF THE DRAWINGS

In order that the invention may be more fully understood, embodiments thereof will now be described, by way of example only, with reference to the accompanying drawings in which:

FIG. 12 is a table giving details of the layer structure of the FIG. 11 device, FIG. 13 graphically illustrates the base-emitter junction characteristics of five SL-HBT devices, FIG. 14 graphically illustrates variations of the collector current with collector-emitter bias for a SL-HBT for various values of base current, FIGS. 15 to 22 graphically illustrate the variations of maximum oscillation frequency, maximum available gain, dynamic emitter resistance and base-emitter voltage with collector current density for a SL-HBT and a HBT, FIG. 23 graphically illustrates variations in the gain, power added efficiency, collector efficiency and collector current with output power for a SL-HBT.

DETAILED DISCUSSION OF EMBODIMENTS

Figure 1:
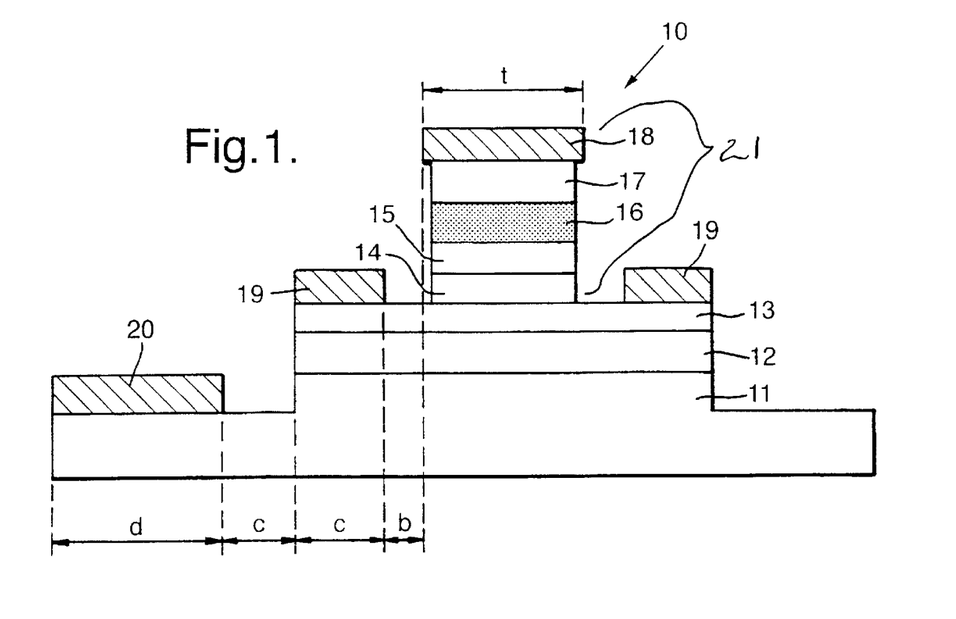
FIG. 1 schematically illustrates a vertical cross-section of a superlattice-heterojunction bipolar transistor (SL-HBT) of the invention.

Referring to FIG. 1, there is shown a semiconductor device of the invention in the form of a superlattice—heterojunction bipolar transistor (SL-HBT) indicated generally by 10. The SL-HBT 10 incorporates successively disposed semiconductor layers, the first layer 11 (a subcollector layer) being in contact with a 500 μm thick undoped GaAs substrate (not shown), and each subsequent layer 12 to 17 being in contact and forming a junction with two respective layers adjacent to it. Details of the layers are as follows:

a subcollector layer 11, a collector layer 12, a base layer 13, an emitter layer 14, an emitter electrode layer 15, layers 16a to 16f, $16g_1$, $16h_1$, $16g_2$, $16h_2$, ... $16g_{25}$, $16h_{25}$ constituting a superlattice region 16, and an electrode layer 17.

The SL-HBT 10 also incorporates the following metal contacts:

a metal emitter contact 18 in contact with the electrode layer 17, a metal base contact 19 in contact with the base layer 13, and a metal collector contact 20 in contact with the subcollector layer 11.

In combination, layers 14 to 17 and the metal emitter contact 18 constitute an emitter mesa 21.

Figure 2:
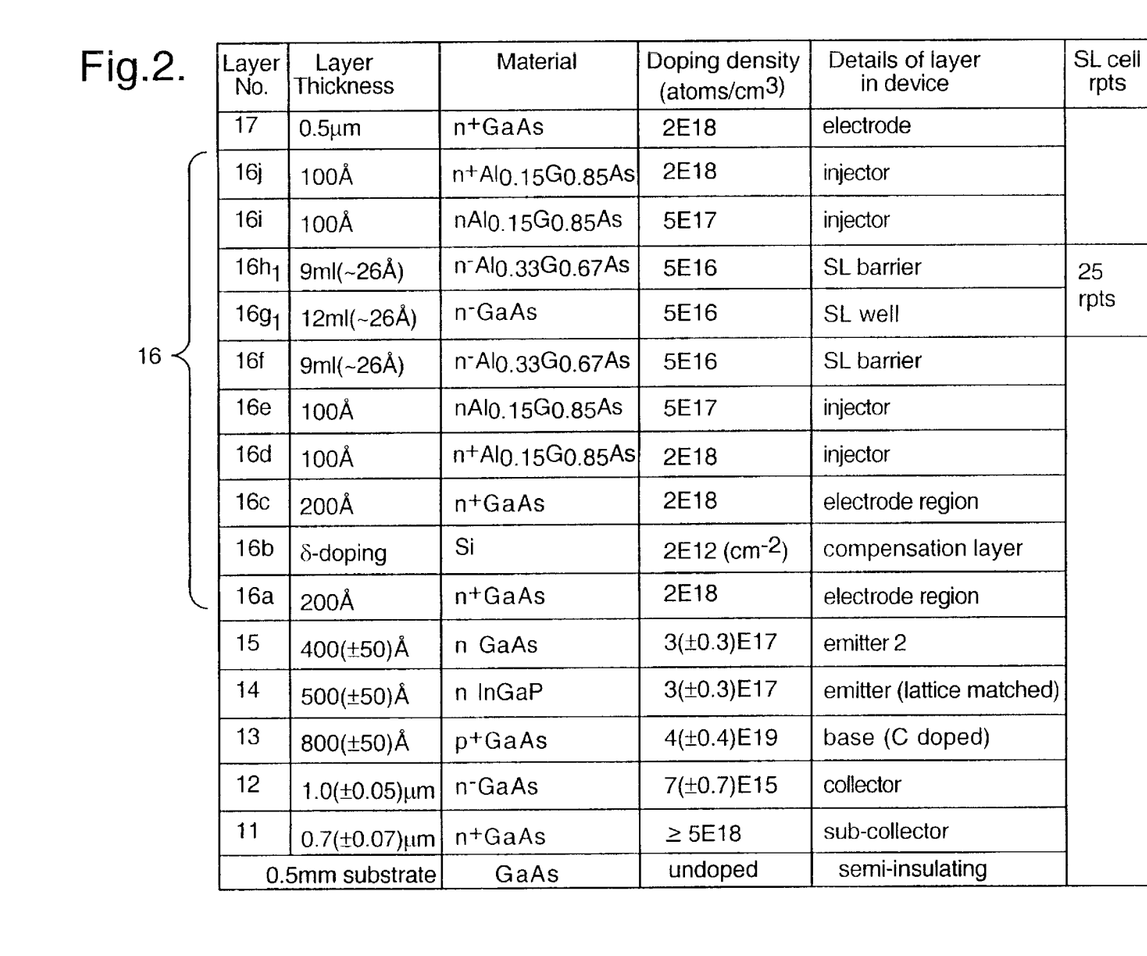
FIG. 2 is a table giving details of the layer structure of the FIG. 1 device, FIG. 3 schematically illustrates the relative lateral positions of metal contacts of the FIG. 1 device, FIGS. 4 to 10 schematically illustrate principal wafer processing steps in the fabrication of the FIG. 1 device.

FIG. 2 is a table giving the thickness, composition and doping density of each of the layers 11 to 17. The pair of layers $16g_1$, $16h_1$ is replicated 24 times, forming the layers $16g_2$, $16h_2$, $16g_3$, $16h_3$, ... $16g_{25}$, $16h_{25}$. Layers $16g_2$, $16g_3$, ... $16g_{25}$ have the same parameters of thickness, composition, doping material and doping density as layer $16g_1$ ignoring variations associated with processing inaccuracies. Layers $16h_2$, $16h_3$, ... $16h_{25}$ have the same parameters as layer $16h_1$ in these respects. Layers $16g_1$, $16g_2$, ... $16g_{25}$ are quantum well layers and layers $16f$ and $16g_1$, $16g_2$, ... $16g_{25}$ are their associated barrier layers. A quantum well layer and an adjacent barrier layer have a difference in conduction band edge energy known as a barrier height.

The layers 11 to 13 and 15 to 17 are all derived from the $Al_xGa_{1-x}As$ material system, where x=0, 0.15 or 0.33. The emitter layer 14 is of InGaP lattice-matched to the GaAs base layer 13.

The metal emitter contact 18 consists of the following successive layers (not shown in detail) each in contact with the next, the first being in contact with the electrode layer 17:

a 5 nm thick layer of nickel,
a 20 nm thick layer of germanium, and
a 480 nm thick layer of gold.

The metal base contact 19 consists of the following successive layers (not shown in detail), each in contact with the next, the first being in contact with the base layer 13:

a 75 nm thick layer of titanium,
a 75 nm thick layer of palladium, and
a 200 nm thick layer of gold.

The metal collector contact 20 has the same composition and structure as the metal emitter contact 18.

Figure 3:
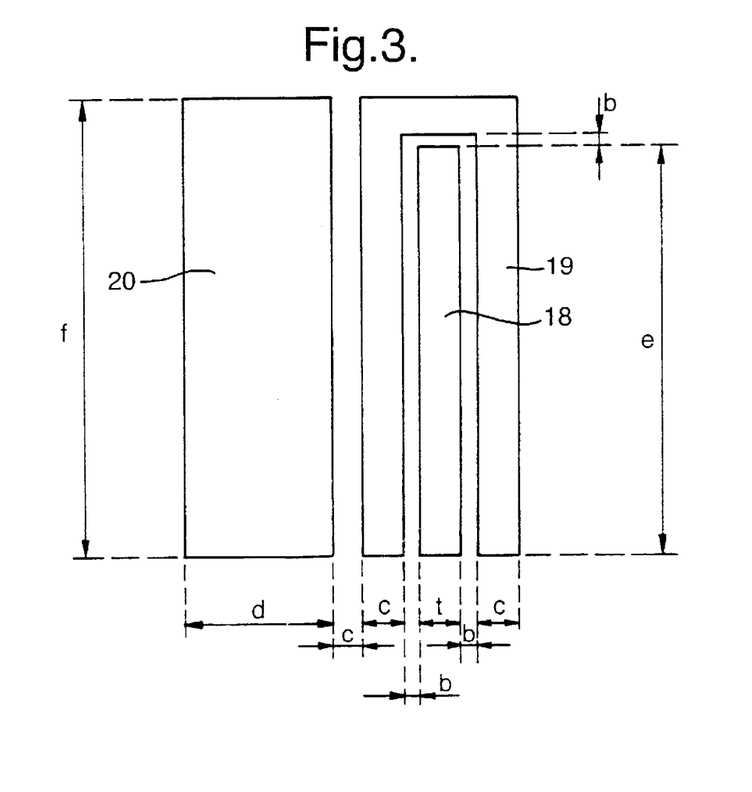

Referring now to FIG. 3, there is shown a plan view of the SL-HBT 10, indicating the lateral positions of the metal emitter contact 18, the metal base contact 19, and the metal collector contact 20. The metal emitter contact 18 is rectangular and has a width t of 3 μm and a length e of 30 μm. The metal base contact 19 is U-shaped; it has a width c of 2 μm and surrounds the metal emitter contact 18 as shown. The separation b of the metal emitter contact 18 and the metal base contact 19 is 1.5 μm. The metal collector contact 20 has a width d of 10 μm and a length f of 33.5 μm, and is separated from the metal base contact 19 by a distance c of 2 μm.

The fabrication of the SL-HBT 10 has two principal stages, namely wafer growth and wafer processing. In the wafer growth stage, the layer structure of the SL-HBT 10 is deposited on a 500 μm thick undoped GaAs substrate in the order shown in the table in FIG. 2. Layers 11 to 16a are laid down by metal-organic vapour-phase epitaxy (MOVPE). MOVPE growth is stopped after layer 16a, and the wafer is transferred to a molecular beam epitaxy (MBE) reactor. Layers 16b to 17 are deposited by MBE. Layer 16b is an n-type doping layer consisting of a partial single-atomic layer of silicon having an areal density of $2 \times 10^{12}$ atoms $cm^{-2}$.

Figure 4:
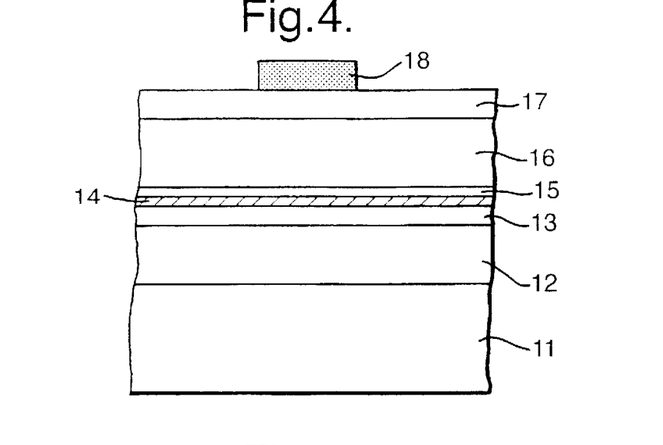
Figure 5:
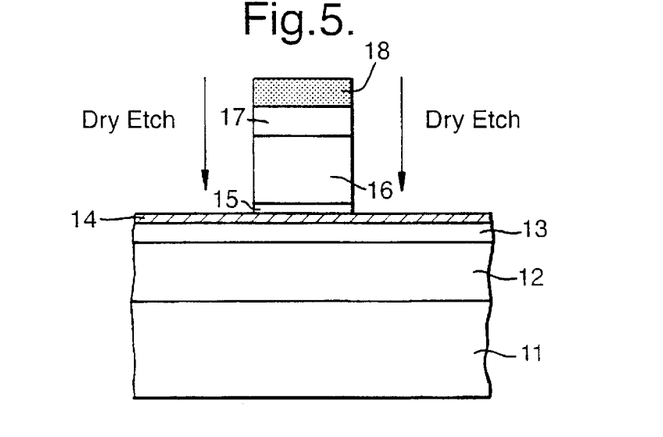
Figure 6:
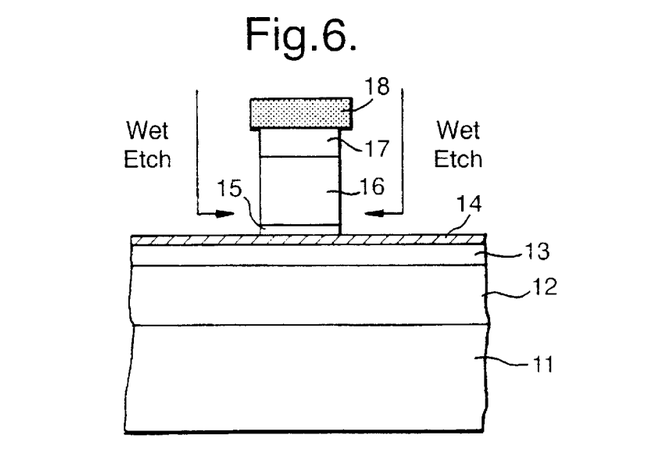
Figure 7:
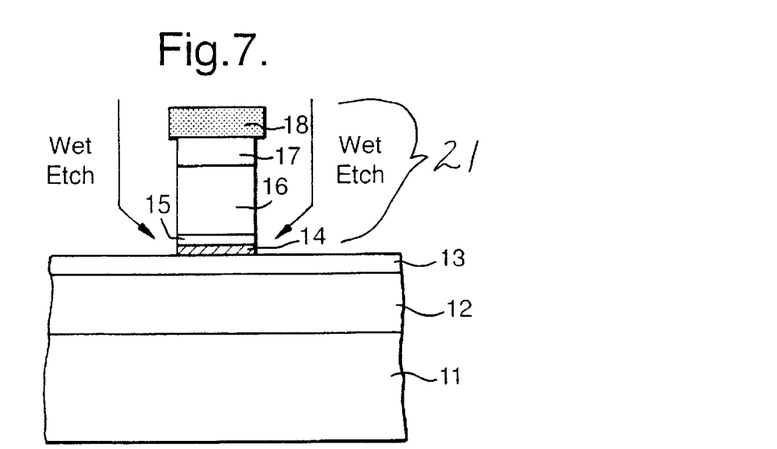
Figure 8:
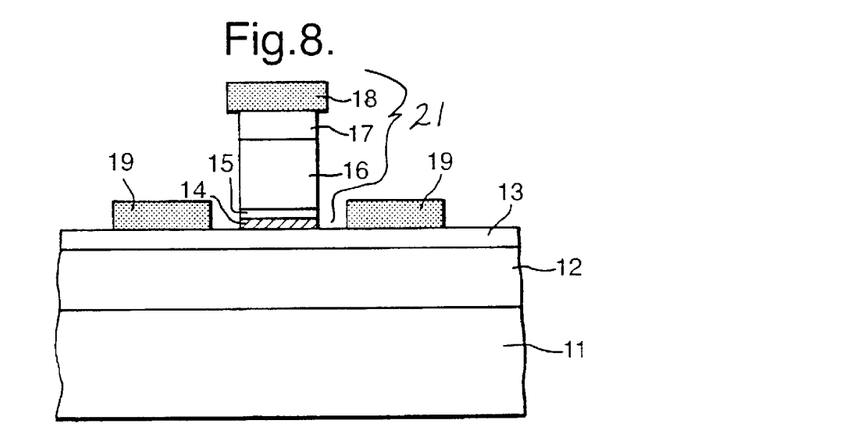
Figure 9:
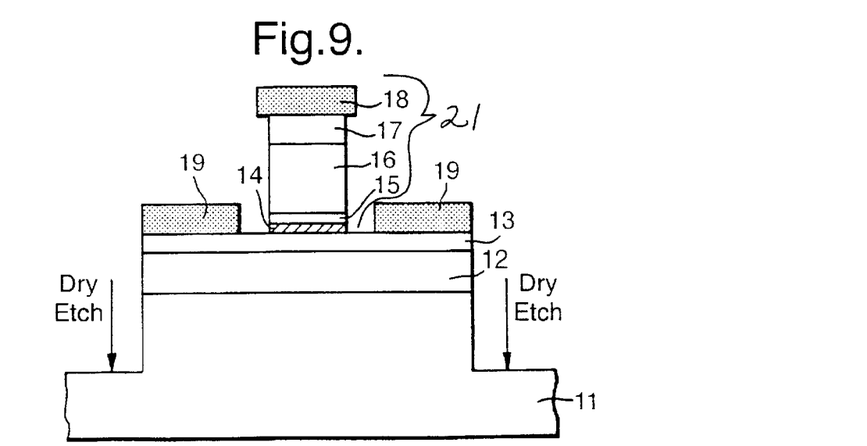
Figure 10:
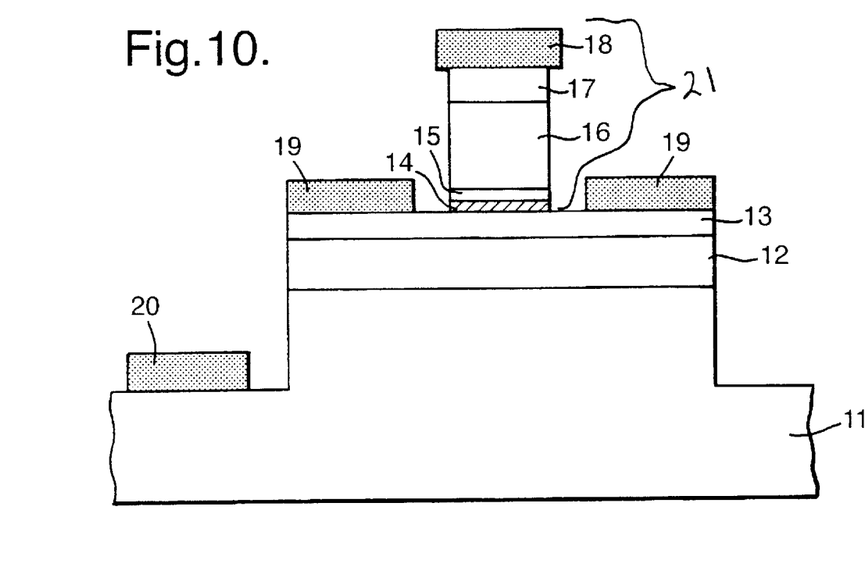

The wafer processing stage defines the lateral structure of the SL-HBT 10, and is carried out using known techniques of photolithography, dry etching and wet etching. The first step in the wafer processing stage, illustrated in FIG. 4, is the deposition of the metal emitter contact 18 onto the electrode layer 17 by electron-beam evaporation. The wafer is then dry-etched down to 50 to 100 nm above the emitter layer 14 to produce a first portion of the emitter mesa 21, as shown in FIG. 5. A selective wet chemical etchant is used to etch down to the emitter layer 14 and to under-cut the first portion of the emitter mesa 21 as indicated in FIG. 6. Referring to FIG. 7, a selective wet chemical etchant is then used to etch through the emitter layer 14, stopping at the base layer 13 to complete the emitter mesa 21. The metal base contact 19 is deposited by electron-beam evaporation (FIG. 8), and the collector layer 12 and subcollector layer 11 are defined by dry etching (FIG. 9). Finally, the metal collector contact 20 is deposited by electron-beam evaporation (FIG. 10.)

Figure 11:
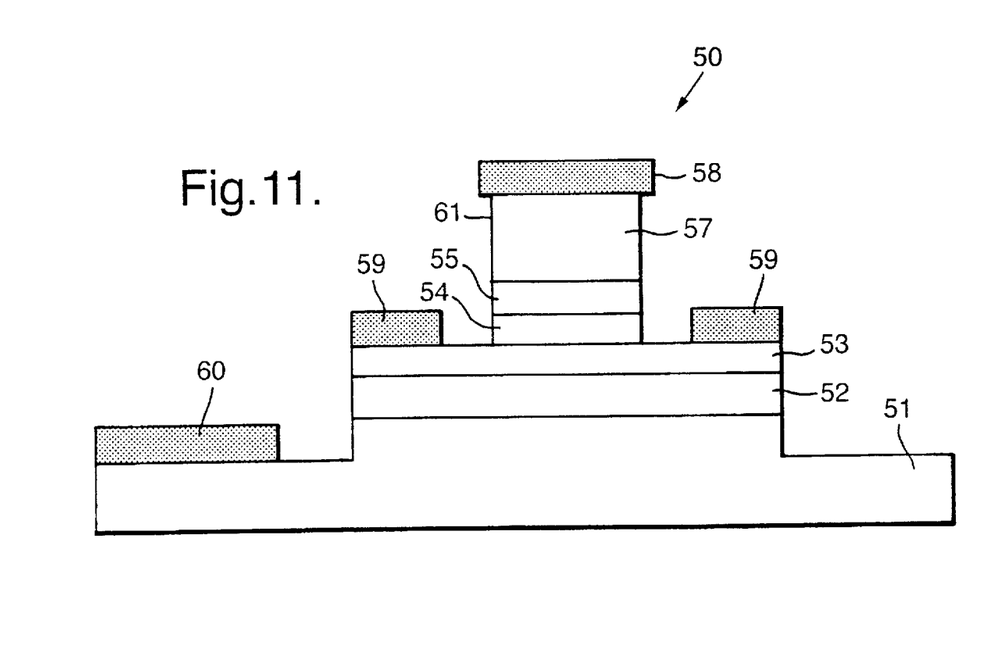
FIG. 11 is a vertical section through a heterojunction bipolar transistor (HBT) of the invention.

In order to illustrate the advantages of the SL-HBT 10, the construction and performance of a prior-art device, a heterojunction bipolar transistor (HBT), will also be described. Referring to FIG. 11, there is shown a vertical cross-section of a HBT indicated generally by 50. The HBT 50 incorporates the following semiconductor layers in the following order, each in contact and forming a junction with the next, the first layer being in contact with a 500 μm thick undoped GaAs substrate:

a subcollector layer 51,
a collector layer 52,
a base layer 53,
an emitter layer 54,
an emitter electrode layer 55, and
an electrode layer 57.

The HBT 50 incorporates the following metal contacts:

a metal emitter contact 58 in contact with the electrode layer 57,
a metal base contact 59 in contact with the base layer 53, and
a metal collector contact 60 in contact with the subcollector layer 51.

Layers 54 to 57 and the metal emitter contact 58 constitute the emitter mesa 61.

Figure 12:
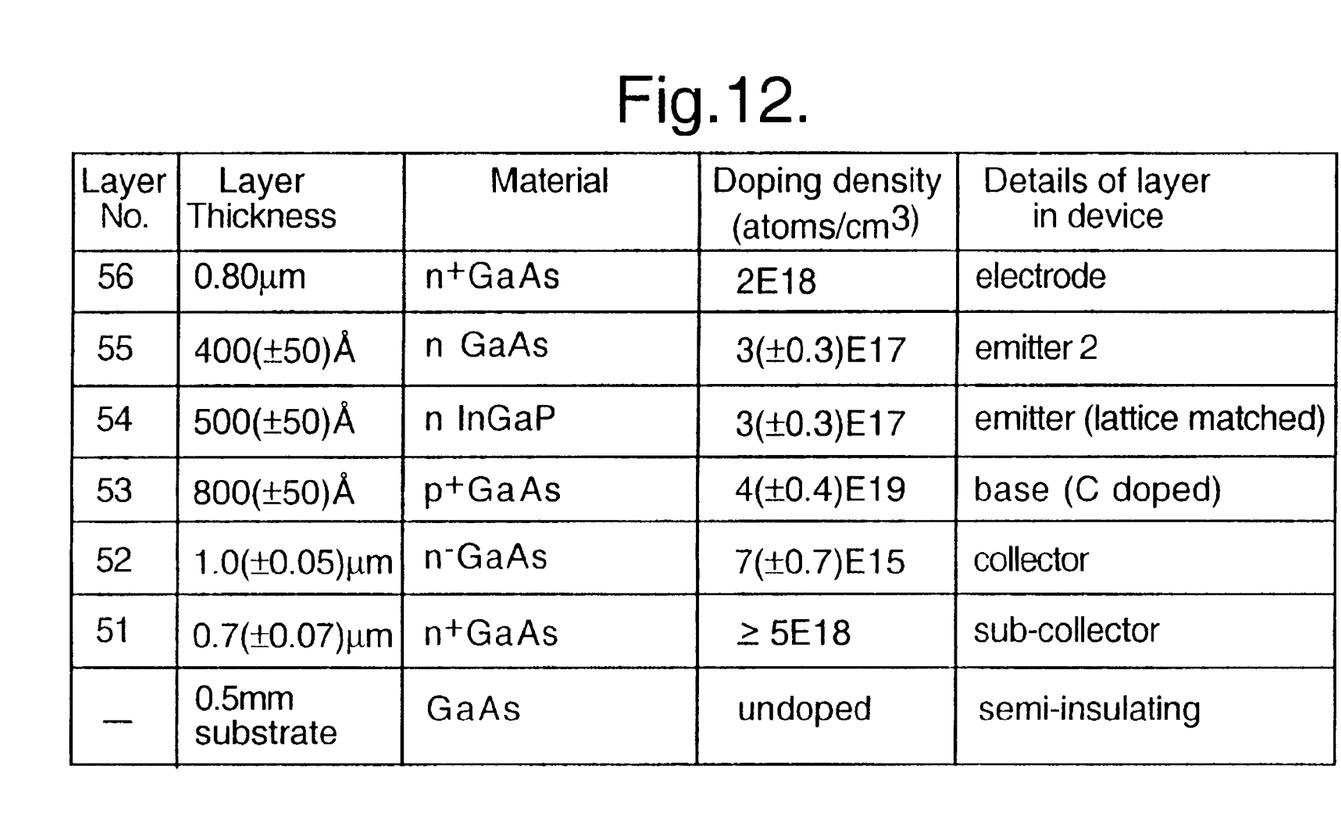

The HBT 50 has the same external dimensions (not shown) t and b to f as defined earlier for the SL-HBT 10. FIG. 12 shows a table of the layer structure of the wafer from which the HBT 50 is made, giving the thickness, composition and doping density of each of the layers 51 to 56. The layers 51 to 56 are grown entirely by MOVPE. Layers 51 to 55 are as nearly as possible identical to those of the SL-HBT 10. The electrode layer 57 has a thickness of 0.8 μm, so that the total thickness of the epitaxial layers of the HBT 50 is the same as that of the SL-HBT 10. Layers 51 to 55 are at the same distance from the emitter contact 58 as the layers 11 to 15 are from the metal emitter contact 18 in the SL-HBT 10. A direct comparison of the performances of the SL-HBT 10 and the HBT 50 may therefore be made. The wafer processing stage of the fabrication of the HBT 50 is identical to that for the SL-HBT 10.

The metals contacts 58, 59 and 60 are identical to the metal contacts 18, 19 and 20.

Figure 13:
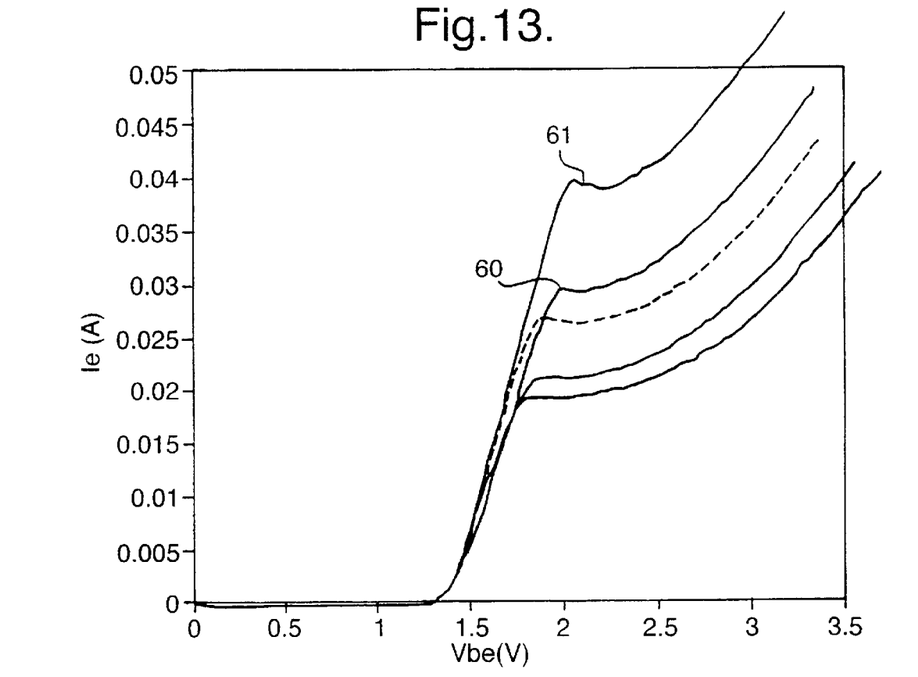

Referring now to FIG. 13, there are shown five graphs of emitter current (Ie) in amps as a function of base-emitter bias (Vbe) in dc volts for five separate SL-HBTs, such as 10. These graphs show large and abrupt reductions in gradient, such as 60, indicating large increases in the resistances of the base-emitter junctions of the SL-HBTs. At critical values of emitter current, such as 60, the emitter current is limited. In some cases there is also region of negative differential resistance, such as 61. FIG. 13 therefore demonstrates the current-limiting effect of the superlattice region 16. An ideal SL-HBT has an Ie versus Vbe characteristic with a substantially linear first region of non-zero slope $m_1$ between 0.25 and $1\Omega^-$ and a second region with a slope $m_2$ in the range $-0.05\,m_1 \leq m_2 \leq +0.05\,m_1$. Ideally the critical emitter current density is twice that of the optimum drive current density of the SL-HBT.

Figure 14:
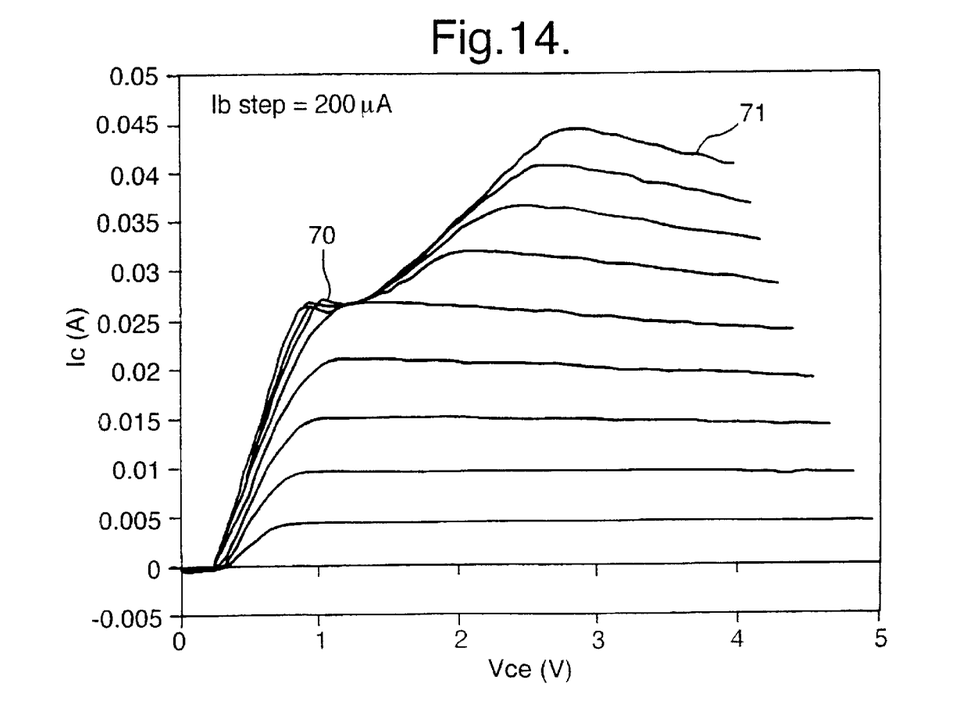

FIG. 14 shows graphs of the collector current (Ic) in amps as a function of the collector-emitter bias (Vce) in dc volts for a single SL-HBT such as 10, operating in the common emitter configuration, for a range of base currents (Ib) starting at zero and increasing in steps of 200 μA. The emitter-current-limiting behaviour is again clearly demonstrated by current plateau regions such as 70 and regions of negative differential resistance such as 71.

The radio-frequency (RF) characteristics of the SL-HBT 10 and of the HBT 50 will now be described.

Figure 15:
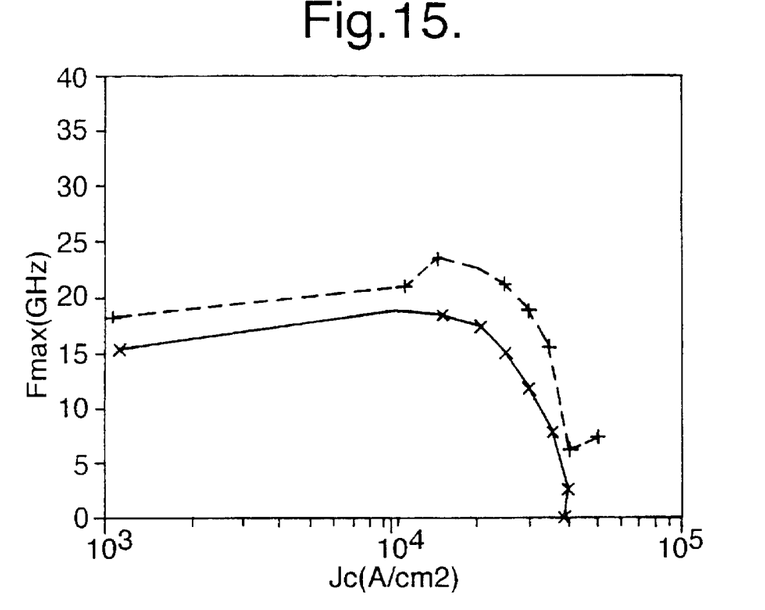
Figure 16:
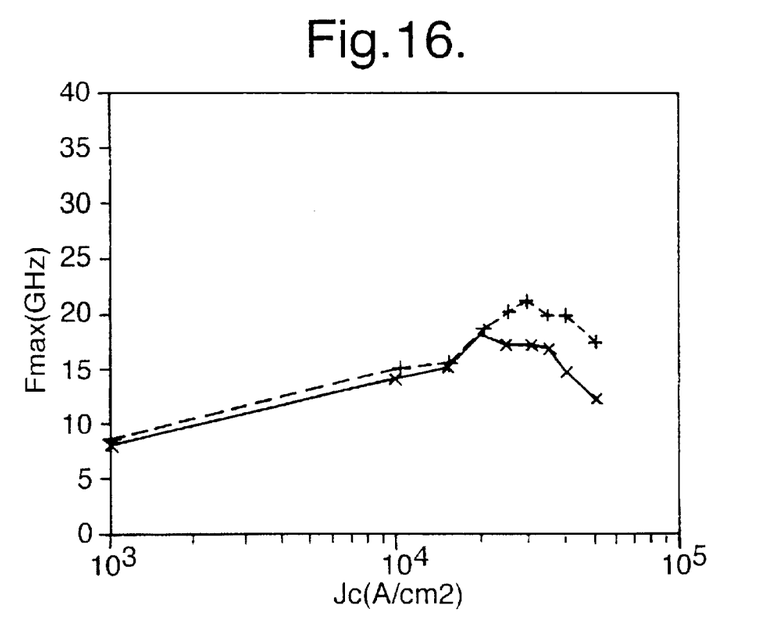

FIG. 15 shows graphs of the maximum frequency of oscillation of the SL-HBT 10 (Fmax) in GHz as a function of collector current-density (Jc) in amps per square centimeter, at two values of the collector-emitter bias, namely 1.1 volts (solid line) and 3 volts (dotted line). FIG. 16 shows equivalent graphs for the HBT 50, except that a solid line represents the performance of the HBT 50 when the collector-emitter bias is 1.5 volts. FIGS. 15 and 16 show that the SL-HBT 10 has a maximum frequency of oscillation comparable to that of the HBT 50 over the indicated range of collector current-density, and that the inclusion of the superlattice region 16 within the SL-HBT 10 does not compromise RF performance any more than the inclusion of a fixed ballast resistor.

Figure 17:
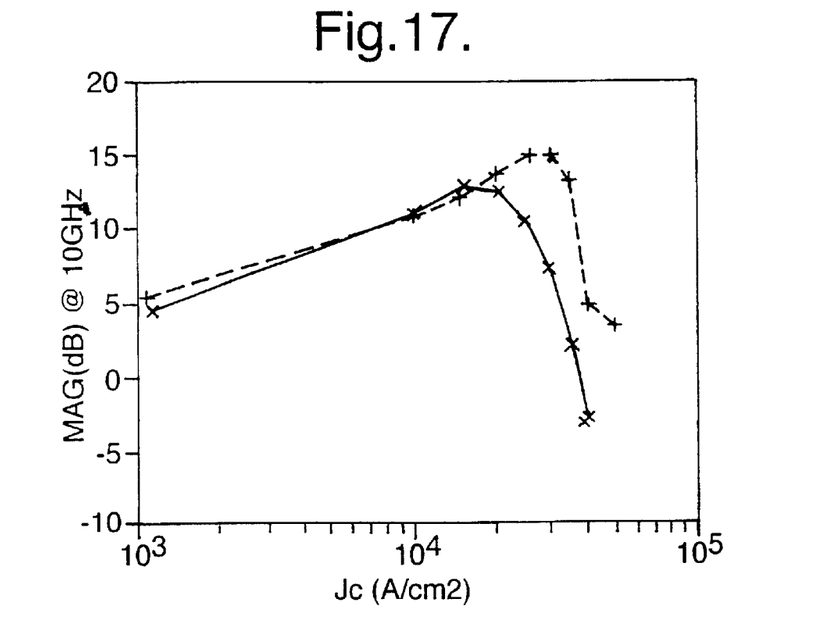
Figure 18:
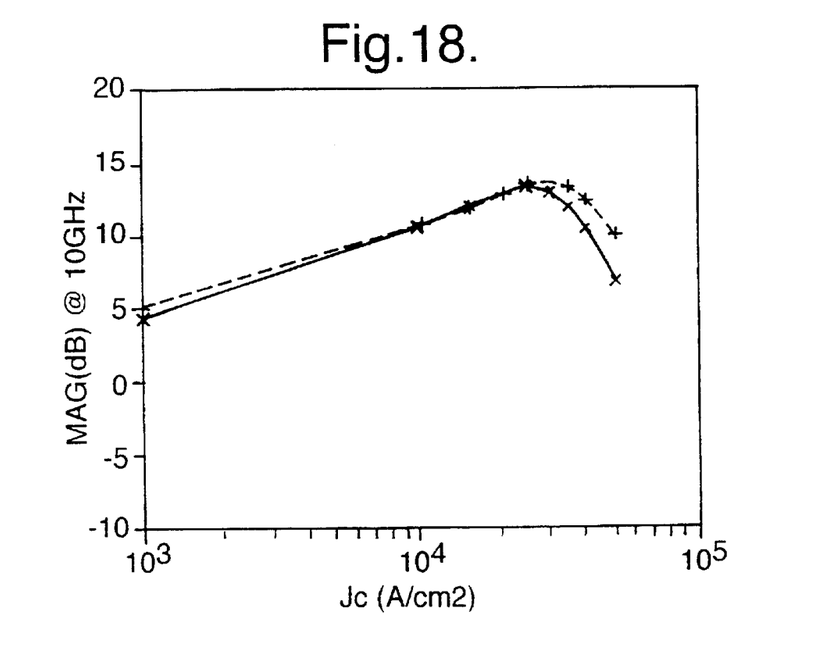

FIG. 17 shows the maximum available gain (MAG) of the SL-HBT 10 in dB at 10 GHz as a function of collector current-density (Jc) in amps per square centimeter for the same collector-emitter bias values as in FIG. 15. FIG. 18 shows equivalent graphs for the HBT 50, at the same values of emitter-collector bias as in FIG. 16. FIGS. 17 and 18 illustrate that the presence of the superlattice region 16 in the SL-HBT 10 does not reduce the maximum available gain from that available in the HBT 50 when the collector current density is in the range $10^3$14 $10^4$ A $cm^{-2}$.

Figure 19:
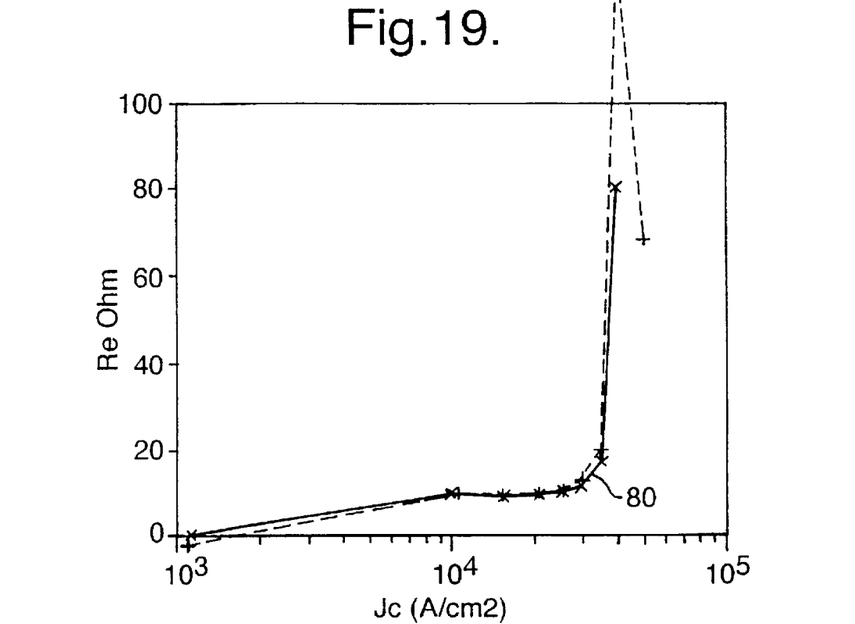
Figure 20:
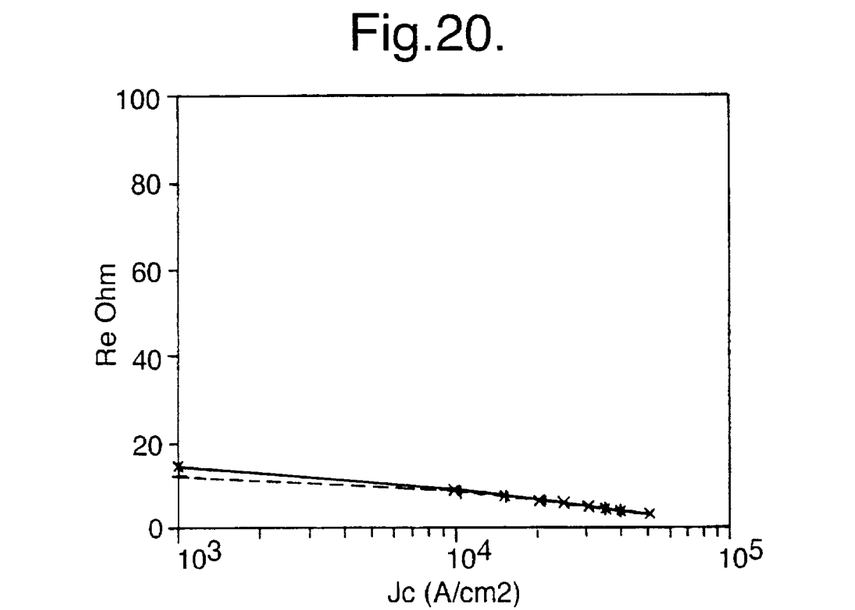

FIG. 19 shows the dynamic emitter resistance (Re) of the SL-HBT 10 in ohms as a function of collector current-density (Jc) in amps per square centimeter for the same collector-emitter bias values as in FIG. 15. FIG. 20 shows equivalent graphs for the HBT 50, at the same values of emitter-collector bias as in FIG. 16. The values of the dynamic emitter resistance have been deduced using an equivalent circuit model. FIG. 20 shows that the HBT 50 exhibits a gradual decrease in dynamic emitter resistance as the collector current density is increased over the range indicated. This is normal behaviour for a HBT such as 50. FIG. 19 shows that the dynamic emitter resistance characteristics of the SL-HBT 10 have sharp increases at points such as 80, indicating that the emitter current density is being limited to an approximately constant value by the superlattice region 16.

Figure 21:
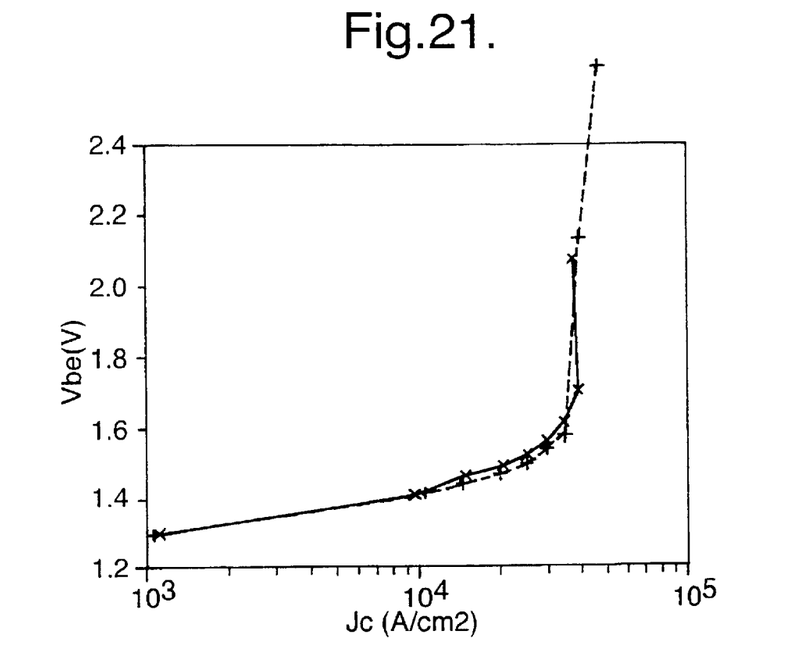
Figure 22:
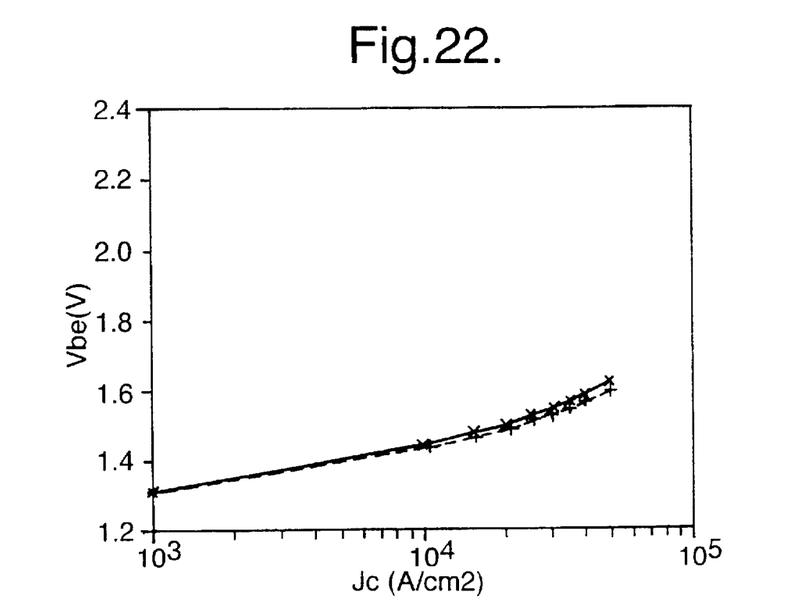

FIG. 21 shows the base-emitter voltage (Vbe) of the SL-HBT 10 in volts as a function of collector current-density (Jc) in amps per square centimeter for the same collector-emitter bias values as in FIG. 15. FIG. 22 shows equivalent graphs for the HBT 50, at the same values of emitter-collector bias as in FIG. 16. FIG. 21 shows that as the collector current density in the SL-HBT 10 increases, the increase in dynamic emitter resistance is accompanied by corresponding increase in the base-emitter voltage as the current limiting regime of the superlattice region 16 is approached. This effect, which does not occur in the HBT 50 and is therefore not seen in FIG. 22, opposes the thermal runaway of the emitter current which leads to the failure of HBT devices such as 50.

Figure 23:
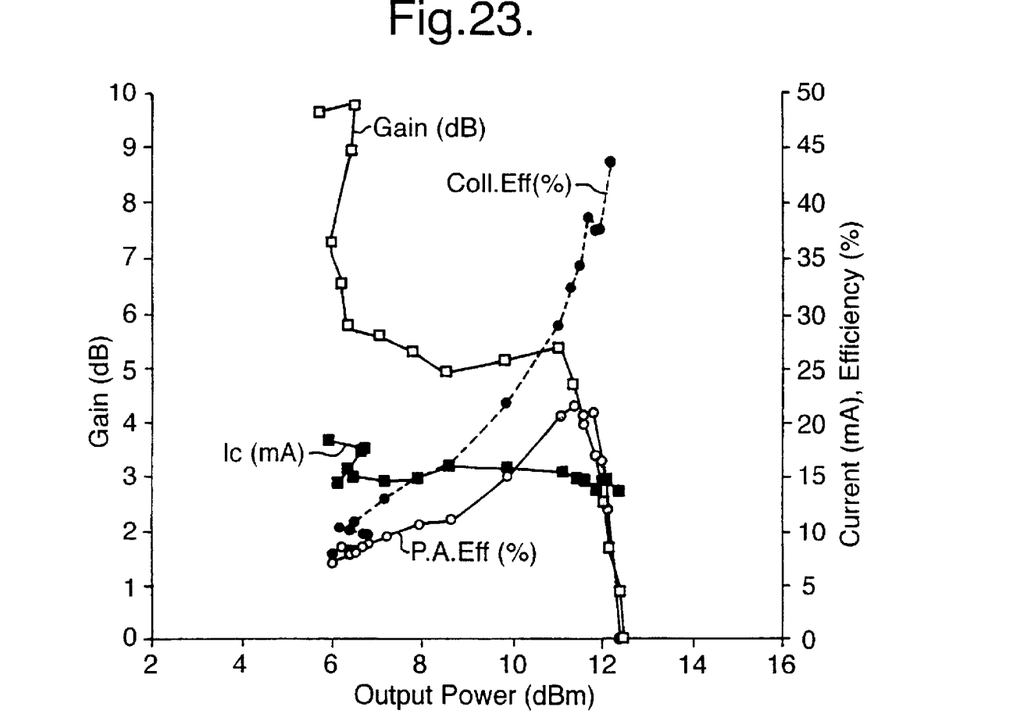

Referring now to FIG. 23, there are shown power transfer characteristics for the SL-HBT 10 when operated for maximum output power. The characteristics shown are the gain in dB, the power added efficiency (PAE) in %, the collector efficiency in %, and the collector current in milliamps. These were obtained using RF input pulses having a duration of 450 ns and a 10% duty cycle. The output power was maximised using automated tuning equipment at each value of the RF input power. Each of these characteristics is shown as a function of the output power in dBm. The maximum output power for the SL-HBT 10 under these conditions is 18.5 dBm corresponding to a gain of 1 dB. This result is comparable to that obtainable from typical HBTS, such as 50. FIG. 22 shows that the collector current (Ic) does not rapidly increase as the maximum output power is approached, a feature that is present in HBTs such as 50, and indicates imminent destruction of the device. At the maximum output power of the SL-HBT 10, the collector current is 30% greater than its minimum value (which occurs at a power output of 13 dBm) compared to a HBT such as 50, where it is 50 to 100% larger. This feature of the SL-HBT 10 is attributable to the current-limiting effect of the superlattice region 16. RF testing of the SL-HBT 10 may be carried out using pulses having a duration up to 100 ns longer than those used to test the HBT 50, without causing destructive self-heating. This further illustrates the beneficial current-limiting effect of the superlattice region 16.

Whereas the SL-HBT 10 has a single emitter mesa 21 (i.e. it is a single-finger bipolar transistor), the invention may be a multi-finger bipolar transistor incorporating a plurality of emitter fingers each in contact with a common base layer and each incorporating a superlattice region.

The invention may alternatively be implemented as a single-finger bipolar transistor incorporating a superlattice region within or adjacent the transistor collector or emitter for example. The transistor base, emitter and collector may be of the same or different materials (homostructure or heterostructure). The superlattice avoids thermal runaway occurring as a result of a local hot spot developing in the finger, and this of course could happen in a multi-finger device.

The invention may also be in the form of a multi-finger bipolar transistor in which individual fingers or mesas of the device incorporate individual collector, base and emitter regions, each finger or mesa being in contact with a common region connected to each emitter region.

A hot electron transistor may be configured in accordance with the invention. This transistor is a unipolar device; it may have a single- or multi-finger permeable base or a metal base, or it may be a hot electron tunnelling transistor, in each case having a superlattice or superlattices integrated therein. Each superlattice may be integrated within the or as the case may be each transistor emitter or base or collector. The invention may be implemented as a field effect transistor (FET), which for the purposes of this includes high-electron mobility transistors, (HEMT), pseudo-morphic HEMTs (PHEMT), MESFETs and heterojunction FET (HFET) in addition to more conventional FETs. A superlattice limiter may be incorporated into an FET or a bipolar transistor in accordance with the invention to provide benefits for a number of types of circuit. It can be included in or adjacent to the collector or emitter of a bipolar transistor or the drain or source of an FET to provide current clipping within the natural current limit of the transistor (as previously described) and/or gain limiting at high signal levels. In the prior art, current clipping involves driving a bipolar transistor into saturation generating excess charge storage and degrading gain-bandwidth. The like in an FET leads to significant and harmful forward-gate current and to additional charge storage.

The gain limiting effect is advantageous in circuits requiring a controlled reduction in gain at high signal levels. This function is important for low-noise oscillators where lower phase noise is achieved by reduction of loop-gain at a stable oscillation condition. Prior art gain limiting requires an additional diode component. The use of an integrated superlattice limiter in accordance with the invention allows a reduced number of components to be used and can provide lower noise.

The gain limiting and current limiting functions of transistors of the invention can provide an important benefit for the driver stages of a power amplifier. Here an abrupt transition from linear gain to saturated output is desired for optimal amplifier operation. This allows driver stages to be correctly sized so as to maintain good efficiency. The desired behaviour is often not achieved in prior art amplifier designs and oversizing of driver stages is required to provide sufficient drive power to the next stage.

A superlattice limiter may be incorporated into a two-terminal semiconductor device such as a pn diode in accordance with the invention, eg in the electrode region of the diode. A diode has a positive thermal coefficient, and the superlattice limiter provides current limiting against thermal runaway.

Figure 24:
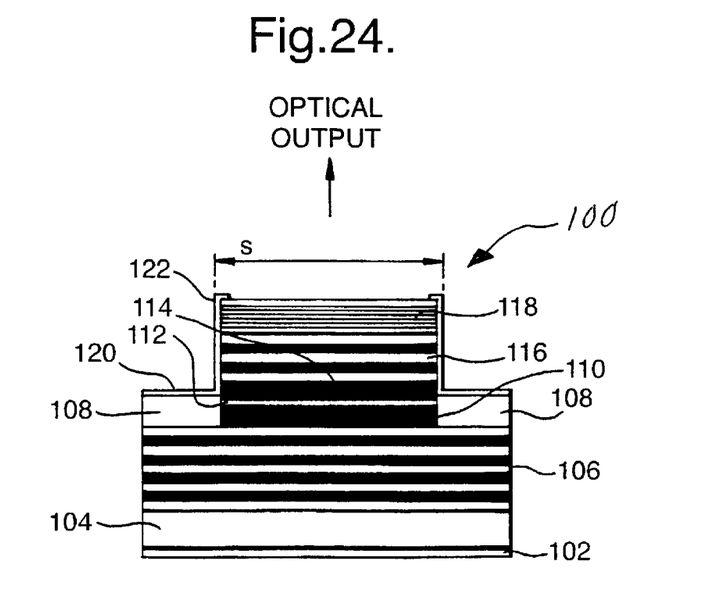
FIG. 24 is a vertical section through a superlattice-vertical-cavity surface-emitting laser (SL-VCSEL), which is a device of the invention.

Referring now to FIG. 24, there is shown a vertical cross-section of another embodiment of the invention, namely a superlattice-vertical-cavity surface-emitting laser (SL-VCSEL) indicated generally by 100. The SL-VCSEL 100 incorporates successively disposed semiconductor layers, the first layer being in contact with an n-type GaAs substrate 104 and being the first layer of the first mirror region 106. Each subsequent layer is in contact and forms a junction with two respective layers adjacent to it. Details of the layers are as follows:

n-type layers constituting a first Bragg-mirror region 106,
an insulating layer 108,
an intrinsic first cladding layer 110,
an intrinsic optical gain layer 112,
an intrinsic second cladding layer 114,
p-type layers constituting a second Bragg-mirror region 116,
p-type layers constituting the superlattice region 118,
a first metal contact layer 102, and
a second metal contact layer 120.

The SL-VCSEL 100 is constructed using known techniques as described in relation to the device 10. The diameter s of the mesa 122 may be in the range 5 $\mu$m to 20 $\mu$m. The first Bragg-mirror region 106 has a thickness of 3500 nm and the second Bragg-mirror region 116 has a thickness of 2700 nm. The intrinsic optical gain layer 112 has a thickness of 56 nm and may be a single or multiple quantum well structure. Current passing through the SL-VCSEL 100 is limited by the superlattice region 118 in the same manner as described above. The semiconductor layers are of the $Al_xGa_{1-x}As$ material system, where x is in the range 0 to 1.

In operation the SL-VCSEL conducts a current between the two contacts 102 and 120 through the intervening layers 104, 106 and 110 to 118. This produces lasing between the mirror regions 106 and 116, but thermal runaway in the SL-VCSEL 100 is inhibited by the non-linear resistance provided by the superlattice region 118.

Whereas the SL-VCSEL 100 has a single mesa 122, the invention may be an array of SL-VCSELs having two or more mesas, wherein the individual mesas each incorporate a superlattice region and one more active laser regions.

The superlattice region 16 has a structure giving the SL-HBT 10 a conductance with a negative temperature dependence. The SL-HBT 10 therefore has further mechanism which counteracts thermal runaway which is temperature-sensitive rather than current-sensitive. Resistance is increased if the device becomes hot, even if the critical current level has not been reached. This is also useful in devices of the invention having more than one electrically parallel current-carrying element each element incorporating such a superlattice structure. Resistance is increased first in hotter elements whilst cooler elements remain unaffected and suffer no unnecessary reduction in current. The critical current of the SL-HBT 10 also has a negative temperature dependence. The critical current of the SL-HBT 10 has a lower value when the device is at a higher temperature compared to when the device is at a lower temperature. Thus in multi-element devices of the invention, hotter elements experience current limiting at a lower current level than cooler elements.

Examples of the invention have been described which incorporate Indium Gallium Phosphide and the $Al_xGa_{1-x}As$ material system. Other material systems may be employed, such as $Si_xGe_{1-x}$, where x has differing values. Suitable pairs of materials include n-type materials with dissimilar conduction band energies and p-type materials with dissimilar valence band energies.

It is likely to be possible to implement the invention as a device incorporating one or more superlattices each having barrier layers of GaN and quantum well layers of InN or InGaN. An example of such a device is a nitride semiconductor laser or laser array incorporating at least one such superlattice.

A superlattice structure which is potentially suitable for a nitride semiconductor laser includes twelve pairs of layers with n-type doping, each pair comprising a four monolayer thick GaN barrier layer and a six monolayer thick $In_{0.1}Ga_{0.9}N$ quantum well layer. Doping densities for the layers would need to be established by experiment in order to ensure that the superlattice provides the required current limiting. Experimental determination of doping densities in superlattice layers is well known in the art of semiconductor device fabrication. A suitable doping density may be $5 \times 10^{16}$ cm$^{-3}$. A device of the invention is required to have a current versus voltage characteristic similar to those illustrated in FIG. 13, and this provides a test to determine suitable doping densities for the layers of the superlattice, i.e. a device with suitable doping densities has a current versus voltage characteristic which exhibits a change in resistance at a critical device current to prevent the device current from reaching an undesirable level. The superlattice would probably have to be grown by MBE or chemical beam epitaxy (CBE) rather than by MOVPE as it requires a high degree of layer thickness resolution.

What is claimed is:

1. A transistor comprising:

an emitter incorporating a superlattice structure;
a base; and
a collector wherein the transistor has an emitter-current versus base-emitter voltage characteristic which includes
a first region below a voltage corresponding to a critical emitter-current and having a non-zero slope of average value $m_1$;
a second region at the voltage corresponding to the critical emitter-current having a slope of less than $m_1$; and
a third region comprising a current plateau above the voltage corresponding to the critical emitter-current, the plateau having an average slope $m_2$ in the range $-0.05\ m_1 \leq m_2 \leq +0.05\ m_1$.

2. A transistor according to claim 1 characterised in that the emitter-current versus base-emitter voltage characteristic exhibits a conductance which has a negative temperature dependence.

3. A transistor according to claim 2 characterised in that the critical device current has a negative temperature dependence.

4. A transistor according to claim 1 characterised in that the critical device current has a negative temperature dependence.

5. A transistor according to claim 4 characterised in that it is a hot electron transistor or a bipolar transistor.

6. A transistor according to claim 5 characterised in that it is incorporated in an amplifying circuit to provide current-clipping of an input waveform.

7. A transistor according to claim 6 characterised in that the amplifying circuit is a radio frequency amplifying circuit.

8. A transistor according to any preceding claim characterised in that it includes a transistor base of indium gallium phosphide together with layers of the $Al_xGa_{1-x}As$ material system, where x=0, 0.15 or 0.33.

\* \* \* \* \*